Figure 1:
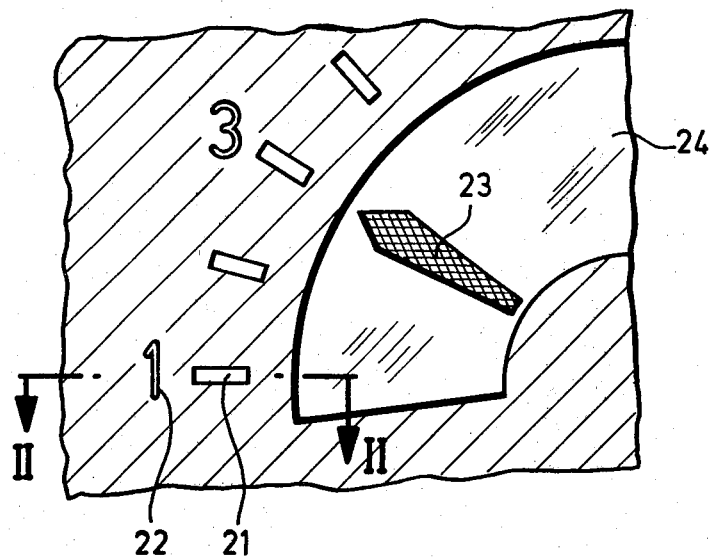

United States Patent [19]

Prohaska et al.

[11] 4,376,934
[45] Mar. 15, 1983

[54] DISPLAY SYSTEM

[75] Inventors: Hans Prohaska; Horst Rachner, both of Bietigheim-Bissingen, Fed. Rep. of Germany

[73] Assignee: ITT Industries, Inc., New York, N.Y.

[21] Appl. No.: 171,473

[22] Filed: Jul. 23, 1980

[30] Foreign Application Priority Data

Aug. 2, 1979 [DE] Fed. Rep. of Germany ....... 2931327

[51] Int. Cl.³ ............................................. G01D 13/04
[52] U.S. Cl. ............................. 340/815.17; 340/52 F; 340/688; 340/713; 340/753; 340/784; 350/344; 350/351; 368/242
[58] Field of Search .................. 340/366 B, 688, 52 F, 340/753, 754, 756, 765, 784, 788, 713; 350/339 R, 344, 351; 368/242

[56] References Cited

U.S. PATENT DOCUMENTS

| | | | |
|---|---|---|---|
| 3,704,056 | 11/1972 | Wysocki et al. | 350/344 X |
| 3,726,250 | 4/1973 | Merk | 340/754 X |
| 3,863,249 | 1/1975 | Olah | 340/788 X |
| 3,912,365 | 10/1975 | Lowell | 350/344 X |
| 3,932,026 | 1/1976 | Sprokel | 350/339 R |
| 4,059,340 | 11/1977 | Kahn et al. | 350/351 X |
| 4,079,369 | 3/1978 | Fukumoto | 340/784 X |
| 4,150,396 | 4/1979 | Hareng et al. | 340/713 X |
| 4,194,199 | 3/1980 | Shepherd et al. | 340/754 |
| 4,247,855 | 1/1981 | Uede et al. | 340/753 |
| 4,277,786 | 7/1981 | Waldron | 340/765 |
| 4,306,233 | 12/1981 | Westbrook | 340/753 |

Primary Examiner—John W. Caldwell, Sr.
Assistant Examiner—Daniel Myer
Attorney, Agent, or Firm—James B. Raden; Harold J. Holt

[57] ABSTRACT

A display system comprising at least one display element, for example in the form of a pivoted pointer for indication of a changing measured value in association with a scale. The display element is implemented by an electro-optical cell filled with a liquid, the cell having two transparent plates separated by a distance frame with an associated illuminating device at the back side. Portions of one of the transparent plates is rendered opaque, the remaining areas on that plate providing transparent windows. Transparent areas are also provided between the plates. One of said transparent areas has a contour corresponding with the contour of the scale. The other of said areas extends over a larger surface.

17 Claims, 14 Drawing Figures

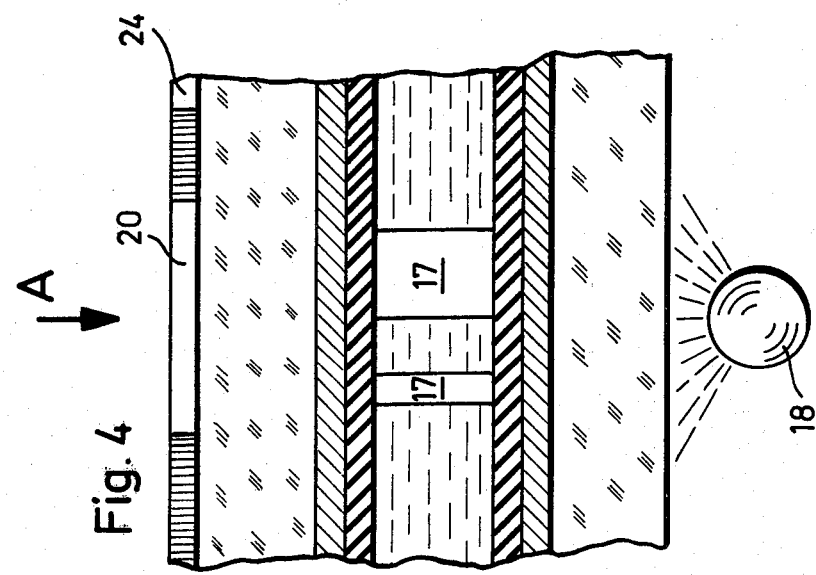
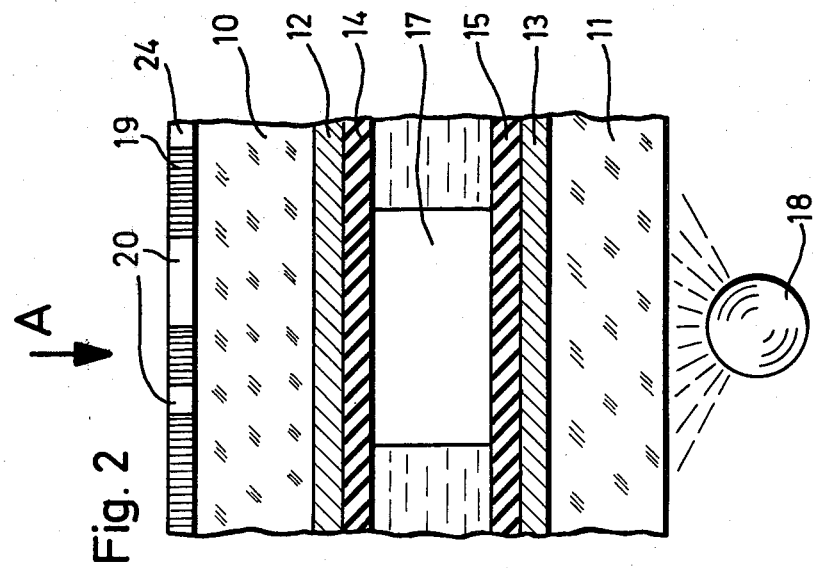

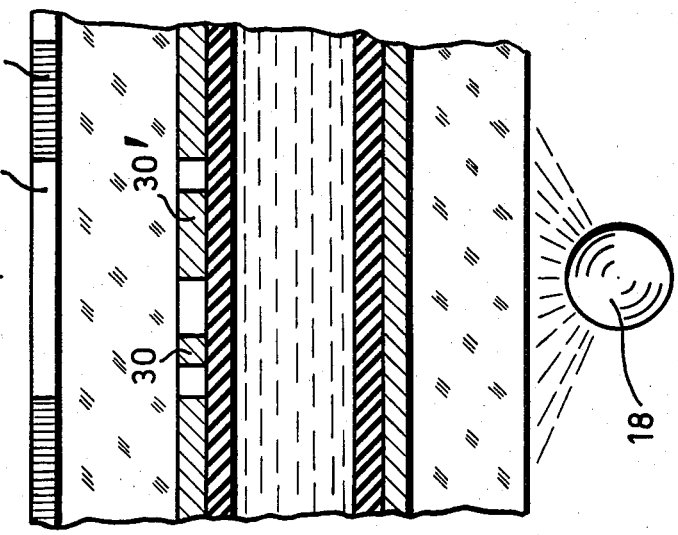
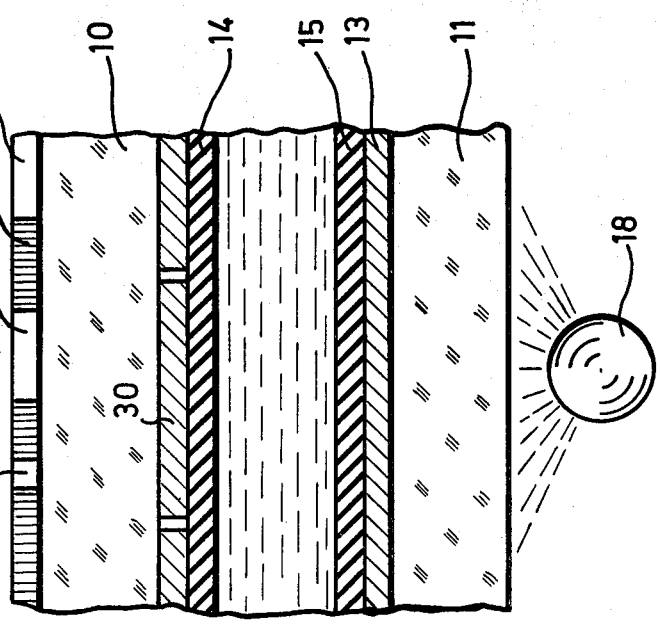

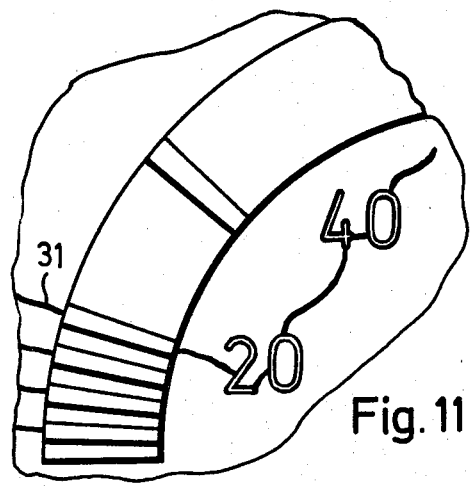
Fig. 11
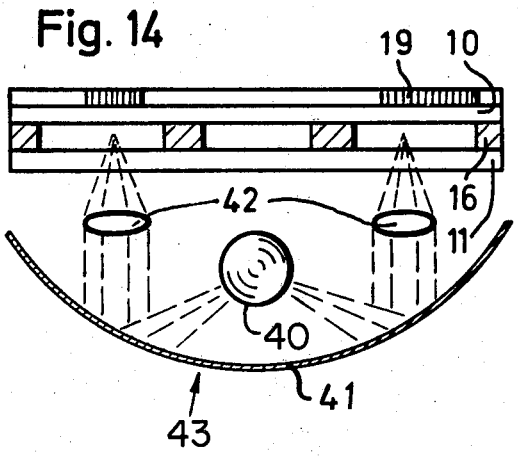
Fig. 14
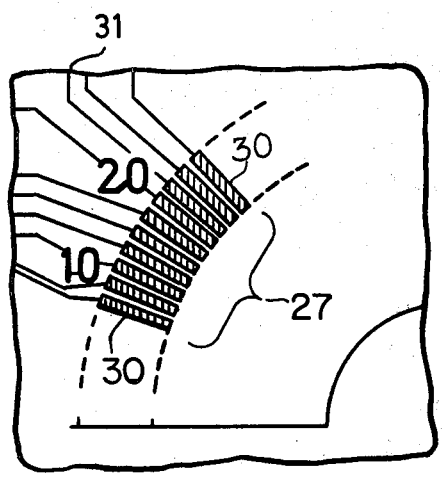
Fig. 9
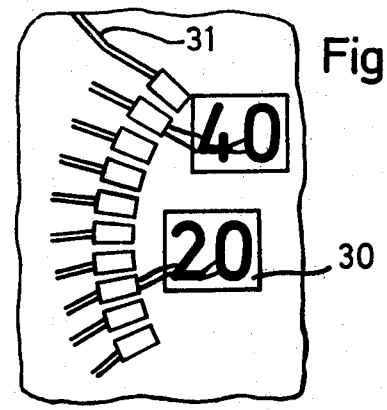
Fig. 10
Fig. 12
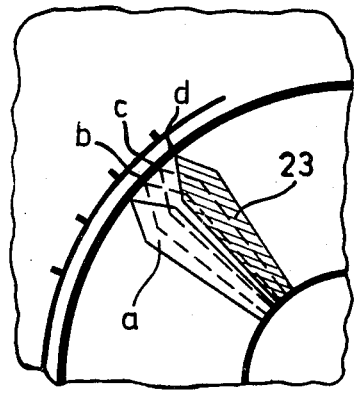
Fig. 13
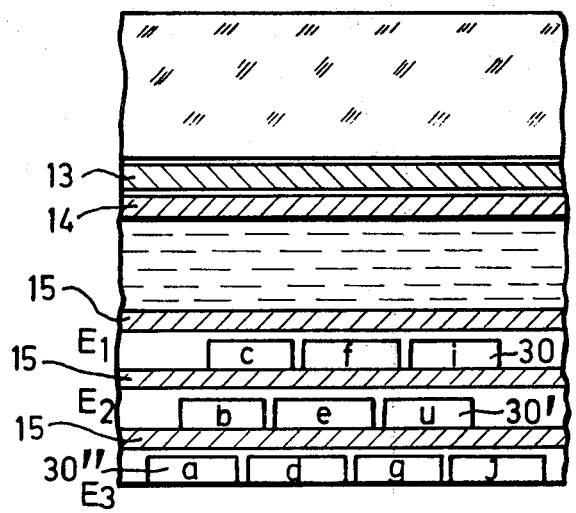

DISPLAY SYSTEM

The invention relates to a display system especially adapted for use in motor vehicles.

Considerable effort is currently being directed to so-called display devices intended to replace usually separate instruments such as tachometers and speedometers. Pointer-type instruments are presently preferred in motor vehicles, whereby a scale with figures and division marks is associated with a pointer in such a way that the actual measured value becomes recognizable. In order to provide that the scale is easily visible when it is dark, it is normally illuminated by a light source from the front side.

The present invention is directed to the problem of adapting known electro-optical cells to conventional devices with as little effort as possible with respect to production engineering in such a way that the overall impression perceived by the driver corresponds to that of conventional instruments. For this purpose, the scale, as well as the pointer or light band, must be clear and easily recognizable when it is light as well as when it is dark.

This problem is solved in accordance with the invention with a display system, especially of the type adapted for motor vehicles, comprising at least one display element containing means for indication of a changing measured value, the means being associated with a scale in such a way that the actual size of the measured value shown by the display element may be recognized, the display element being implemented by an electro-optical cell filled with a liquid, the cell having two transparent plates separated by a distance frame and provided with transparent electrodes, the cell having an associated illuminating device at the back side. Portions of one of the transparent plates are rendered opaque, the remaining areas on that plate providing transparent windows. Transparent areas are also provided between the plates. One of the transparent area has a contour corresponding with the contour of the scale and the other of said areas extends over a larger surface.

It is essential that, for the implementation of the scale, the light from the back of the electro-optical cell be utilized and therefore the incident light necessary with known instruments need not be used. It is furthermore essential that only one of the two transparent areas of the plate or between the transparent plates be developed according to the contour of the scale, so that a slight lateral staggering of the separate transparent areas, which presumably cannot be excluded during production in spite of great effort, does not play an important role. The scale with its division marks and figures is sufficiently clearly recognizable in spite of such a slight staggering.

An especially preferred embodiment of the invention is that version in which the transparent areas between the plates are created by displacement of the liquid. Thereby the scale with its figures and division marks is pictured solely optically without using the electro-optical qualities of the cell filled with a liquid. The liquid can for instance be displaced in such a way that between the plates transparent inserts are arranged which according to an advantageous further development of the invention are preferably developed in one piece with a spacer or distance frame. Thereby the inserts will preferably have a larger surface and the windows in the transparent plate will have a contour which corresponds to the scale to be indicated. It is assumed that such a version can be produced more simply from the standpoint of production engineering than the alternative version in which the inserts have a contour corresponding to the scale with figures and division marks to be indicated and the windows in the transparent plate are bigger.

Of course the transparent areas between the plates can also be realized by the control of appropriate electrodes. Then by corresponding arrangement of the control circuit of the display system, it can be arranged so that for instance only the figure of the scale is indicated which corresponds to the indicating position of the light band or the pointer.

It is difficult to arrange the separate segments in a display element with a pivotable pointer. The width of the segments and thus the angle between two segments cannot be reduced to any size. Thus in known systems the observer perceives a jumping pointer and not a continuously moving pointer. In order to avoid this short-coming, it is suggested that the electro-optical cell be provided with partly overlapping electrodes in several planes each of which is separated from each other by a dielectric layer.

A series of known electro-optical cells, especially so-called colloidal displays, are not fully operative at lower temperatures. Therefore heating has to be provided. In this connection it is suggested that the liquid be heated at selected locations by the rays of the already provided illuminating device, so that the liquid is circulated between the transparent plates. This can very simply be achieved by the separate insertion of convex lenses into the path of rays of the illuminating device.

Figure 3:
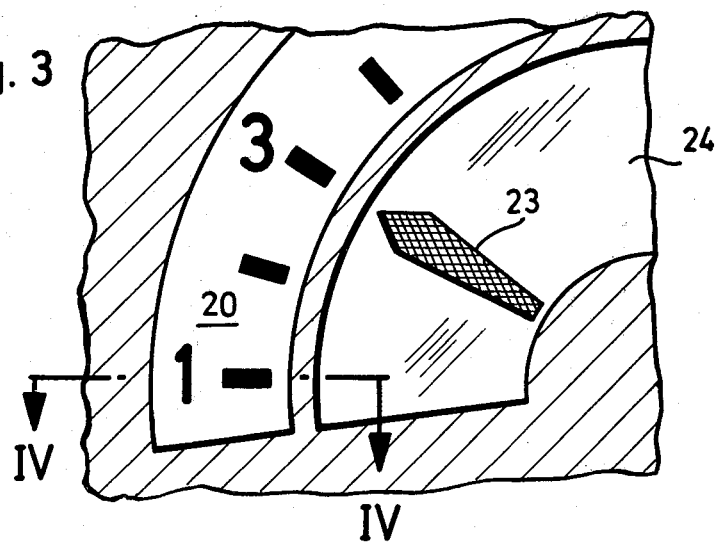
Figure 5:
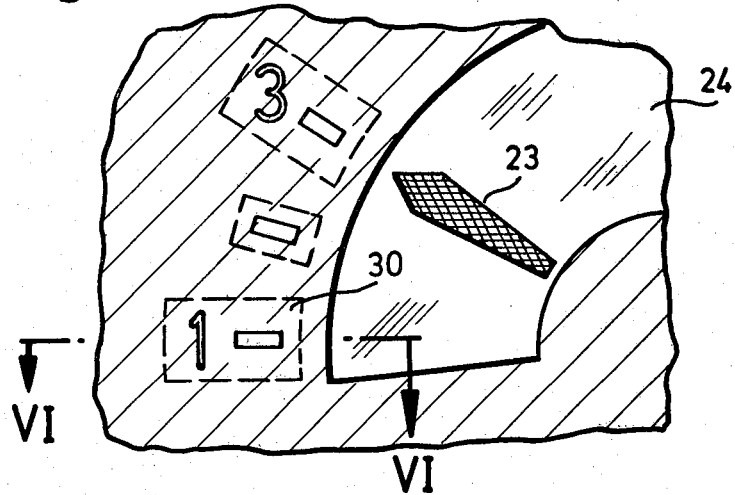
Figure 7:
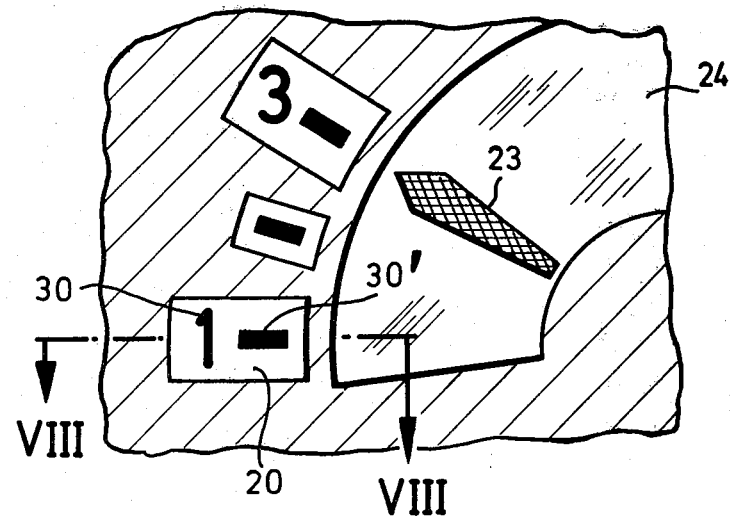

The invention is described in detail below by reference to the embodiments shown in the accompanying drawing, in which FIG. 1 is a partial view of the front side of an electro-optical cell, FIG. 2 is a section not necessarily to scale taken along the line II—II of FIG. 1, FIGS. 3 and 4 are a view of and a section through another embodiment with solely optical implementation of the scale, FIGS. 5 to 8 are views of and sections through other embodiments with control of particular electrodes for representation of the scale, FIGS. 9 to 11 are views of the transparent plate with vapor-deposited electrodes, FIGS. 12 and 13 are a view of and a section through a display element with a pointer, and FIG. 14 is a considerably simplified section through an entire display system.

The electro-optical cell according to FIGS. 1 and 2 consists of two plates of glass 10 and 11 on each of which a conductive layer 12 or 13 with several electrodes is vapor-deposited. On said layer there is one insulating layer 14 and 15, which are transparent as well. The two plates of glass 10 and 11 with the layers deposited thereon are held at a given spacing by a spacer or distance frame 16 (see FIG. 14) of which only a part is visible in FIG. 2 and that is the insert 17. Moreover, the space between the plates of glass is filled by a liquid whose optical qualities are variable through control of the electrodes 12 and 13. On the backside of the cell there is an illuminating device 18. In the direction of view in front of the plate of glass 10, there is an opaque foil 19 which is provided with windows. FIG. 2 shows a section in the direction of view of the arrow A on the foil 19, whereby the hatched area is opaque. The windows 20 have a contour which corresponds to the division marks 21 or to the numerals 22. These marks and numerals as a whole can be designated as a scale. To this scale a display element with a pivotable pointer 23 is assigned. The foil 19 has a circular ring-shaped recess 24 in the area in which the pointer 23 can move.

In the embodiment according to FIGS. 1 and 2, the scale with the figures and division marks is solely implemented on an optical basis. For this purpose the liquid between the plates 10 and 11 is displaced by a transparent insert 17. Because all other layers of the cell are transparent, these figures and numbers become visible in direction of view A as soon as the illuminating device 18 is switched on. Thereby the electro-optical qualities of the cell are not utilized. From FIG. 2 it can be seen that the transparent area between the plates which is formed by the insert 17 is larger than the outside contour of the windows 20 in the printed foil 19 on the front plate of glass. This is logical for reasons of manufacture, as already mentioned above.

The embodiment according to FIGS. 3 and 4 is in effect the reverse of FIGS. 1 and 2 in which the electro-optical qualities of the cell are not utilized either. In this sytem the inserts 17 between the glass plates are formed in such a way that their contour corresponds to that of the symbols to be indicated. The transparent area in the printed foil formed by the windows 20 in contrast thereto has a larger surface. As FIG. 3 shows, said windows 20, as a circular ring-shaped recess, covers all inserts for the formation of the various figures and division marks.

FIGS. 5 to 8 show embodiments in which the electro-optical qualities of the cell are utilized. Again there are two transparent areas of different width provided. In the embodiment according to FIG. 6, the windows 20 in the foil 19 correspond to the marks and figures to be indicated. When the electrode 30 and the counter electrode 13 are energized, the liquid in the area below said electrode 30 becomes transparent, so that thereby a second transparent area with a larger surface is created. The embodiment according to FIGS. 7 and 8 corresponds on the whole to that of FIGS. 3 and 4 insofar as again the windows 20 in the printed foil 19 has a larger surface. However, several electrodes 30, 30' are controlled, so that transparent areas in the liquid are created whose contour corresponds to that of the characters to be pictured.

Thus in all embodiments two transparent areas are provided of which one has a contour corresponding to the characters to be pictured and the other has a larger surface. The areas corresponding to the characters can either be provided in the printed foil or between the glass plates. The transparent areas between the glass plates can either be provided by displacement of the electro-optical liquid or by utilization of the electro-optical effect of the cell.

FIG. 9 shows a partial view of one of the glass plates with the various separately controllable electrodes 30. The figures of the scale are also indicated by control of correspondingly developed electrodes. From FIG. 9 it can be seen that individual segments of the light are directly connected in an electrically conductive manner to the electrodes of the figures and that connecting leads 31 are conducted from these figures to the rim of the cell. This means that for instance when a speed of 10 km/h is to be indicated, the first electrodes of the light band and additionally the FIG. 10 flashes up. The remaining electrodes as well as the FIG. 20 and the following figures in contrast thereto remain dark or are only weakly seen. If the speed is increased to a value exceeding 20, the figure 20 of the scale flashes on additionally. On the whole, it can be stated that at any given time only those figures are seen which are smaller than the present measured value. In other embodiments which are not shown in the drawing one could also provide that the only figure made visible is that which is next to the measured value.

Whereas in the embodiment according to FIG. 9 the figures are located between the display element 27 and the connecting wires 31, FIG. 10 shows an embodiment in which the figures are attached on the side facing the display element 27. This proves to be suitable because, when there are many individually controllable elements within the display element 27, under certain circumstances it is difficult to conduct the wires in the embodiment according to FIG. 9. A difference between FIGS. 9 and 10 also exists in that in the first case the electrodes have a contour corresponding to the figures to be represented, whereas in the second case the electrodes are approximately square fields provided in the printed foil. Thus the one embodiment in general corresponds to that of FIGS. 5 and 6, the other to that of FIGS. 7 and 8.

FIG. 11 shows an embodiment similar to FIG. 10, whereby however the individual figures are all connected with each other and switched to an electrode of the display element which flashes on with a low measured value. As soon as this measured value is reached all figures of the scale flash on.

FIGS. 12 and 13 refer to a suitable version of a display element with a moving pointer. In this embodiment, in the planes $E_1$, $E_2$ $E_3$, electrodes 30, 30', 30" each are arranged in accordance with the contour of the pointer to be pictured. These electrodes or diodes overlap partly and are controlled in alphabetical succession when the measured value is increasing according to FIG. 12. Therefore the pointer moves forward in only very small steps, so that the pointer does not appear to be jumping.

In FIG. 14 a schematic section through the entire display is shown which comprises several display elements for representation of velocity, rotational speed, time and the like. The display includes foil 19 and two glass plates 10, 11, which are held at a spacing by the distance frame 16. The illuminating device 43 consists of the bulb 40 and an associated reflector 41. In the path of the rays of this illuminating device, lenses 42 are inserted which collect the light of the illuminating device. The light energy is therefore pointedly conducted to given places in the liquid layer, so that because of local heating up a circulation of the liquid is insured. Thereby, the light energy may be conducted to places which are covered by the foil in a way that they are not transparent. In this manner, the electro-optical cell still remains operative even when the temperatures are low.

It should be noted that the various embodiments described can be used with completely different types of electro-optical cells. They may utilize so-called colloidal displays (of the type shown for example in U.S. Pat. No. 4,025,163), liquid crystal displays or electro-fluorescence displays.

We claim:

1. In a display system, especially adapted for motor vehicles, comprising at least one display element containing means for indication of a changing measured value, said means being associated with a scale in such a way that the actual size of the measured value shown by the display element may be recognized, said display element being implemented by an electro-optical cell filled with a liquid, said cell having two transparent plates separated by a distance frame and provided with transparent electrodes, said cell having an associated illuminating device at the back side, the improvement in which portions of one of the said transparent plates are rendered opaque, the remaining areas on said one plate providing transparent windows, transparent areas being provided between the plates, one of said transparent areas having a contour corresponding with the contour of the scale and the other of said transparent areas having a larger area than the area having the scale contour.

2. A display system according to claim 1 in which the transparent windows in the one plate have a contour corresponding to the scale to be indicated.

3. A display system according to claim 1 in which the transparent areas between the plates have a contour corresponding to the scale to be indicated.

4. A display system according to claim 1 in which the transparent areas between the plates are created by displacement of the liquid.

5. A display system according to claim 4 in which the transparent areas between the plates are transparent inserts.

6. A display system according to claim 5 in which the inserts are integral with a distance frame.

7. A display system according to claim 1 in which the transparent areas between the plates are controlled through appropriate electrodes.

8. A display system according to claim 7 in which at any given time only that figure is controlled which is the next corresponding to the position of the means for indication of a changing measured value.

9. A display system according to claim 7 in which at any given time only those figures are controlled which are smaller than the measured value at that time.

10. A display system according to claim 7 in which the electrodes which may be activated for the representation of the individual numerals are connected with electrodes of the corresponding segments of the display element.

11. A display system according to claim 7 in which all electrodes which have to be activated for the representation of the figures are connected in an electrically conductive manner with an electrode of the display element which is actuated with a low measured value.

12. A display system according to claim 7 in which the electrodes for the figures are arranged between the electrodes of the means for indication of a changing measured value and the connecting leads conducting to the rim of the cell.

13. A display system according to claim 7 in which the electrodes for the figures are arranged on the side facing the electrodes of the means for indication of a changing measured value, said side being opposite the side with the connecting leads.

14. A display system according to claim 7 in which for the representation of a means for indication of a changing measured value the electro-optical cell has partly overlapping electrodes in several planes which are separated from each other by a dielectric layer and are controlled separately.

15. A display system according to claim 1 in which the scale has figures and division marks and is permanently visible.

16. A display system according to claim 1 in which the liquid in the electro-optical cell is heated at selected locations by the beams of the illuminating device.

17. A display system according to claim 16 in which in the path of rays of the illuminating device several convex lenses are arranged separately and thereby the rays of the illuminating device are intensified at particular places between the plates.

* * * * *